US007602821B2

United States Patent
Hirth et al.

(10) Patent No.: US 7,602,821 B2
(45) Date of Patent: Oct. 13, 2009

(54) DEVICE FOR GENERATING LASER RADIATION IN THE INFRARED

(75) Inventors: Antoine Hirth, Biesheim (FR); Marc Eichhorn, Mannheim (DE)

(73) Assignee: Institut Franco-Allemand de Recherches de Saint-Louis, Saint-Louis (FR)

( * ) Notice: Subject to any disclaimer, the term of this patent is extended or adjusted under 35 U.S.C. 154(b) by 363 days.

(21) Appl. No.: 11/008,614

(22) Filed: Dec. 10, 2004

(65) Prior Publication Data
US 2005/0213615 A1 Sep. 29, 2005

(30) Foreign Application Priority Data
Dec. 18, 2003 (FR) .................................. 03 14860

(51) Int. Cl.
*H01S 3/30* (2006.01)
(52) U.S. Cl. .................... 372/6; 372/3; 372/4; 372/69; 372/70; 372/71
(58) Field of Classification Search ............... 372/3, 372/4, 6, 69, 71, 72
See application file for complete search history.

(56) References Cited

U.S. PATENT DOCUMENTS

| 4,523,315 | A | * | 6/1985 | Stone ............................. 372/3 |
| 5,583,877 | A | * | 12/1996 | MacPherson et al. ........... 372/4 |
| 6,301,271 | B1 | * | 10/2001 | Sanders et al. ................. 372/3 |
| 6,433,921 | B1 | * | 8/2002 | Wu et al. ..................... 359/334 |
| 6,721,092 | B2 | * | 4/2004 | Aozasa et al. ............ 359/341.5 |
| 2003/0012491 | A1 | | 1/2003 | Shaw et al. |
| 2003/0025989 | A1 | | 2/2003 | Grubb et al. |

FOREIGN PATENT DOCUMENTS

EP    0 146 262 A    6/1985

OTHER PUBLICATIONS

Major Jr. et al "High-Power Single-Mode 2.0 μm Laser Diodes", IEEE Photonics Technology Letters, vol. 5, No. 7, Jul. 1993.*
"Recent Advances in Photonic Crystal Fibres", Russell et al., Phillip, Transparent Optical networks, 2003, Proceedings of 2003 5$^{th}$ International Conference on Warsaw, Poland, Jun. 29-Jul. 3, 2003, Piscataway, NJ, USA, IEEE, US, Jun. 29, 2003, p. 8.

* cited by examiner

*Primary Examiner*—Minsun Harvey
*Assistant Examiner*—Yuanda Zhang
(74) *Attorney, Agent, or Firm*—Oliff & Berridge, PLC

(57) ABSTRACT

The invention is in the field of laser radiation generation in bands II and III, and relates to a device for generating laser radiation in the infrared having means for modifying the amplified-radiation frequency and using the Raman effect, characterized by additionally having at least one diode able to emit laser radiation in the 1.8-2.1 μm frequency range, at least one current generator able to generate current levels at an adjustable repetition rate, means for supplying said current levels to said diode, and means for amplifying the laser radiation emitted by said diode and comprised of at least one fiber doped with an ion having laser activity in the diode emission range.

18 Claims, 3 Drawing Sheets

DEVICE FOR GENERATING LASER RADIATION IN THE INFRARED

BACKGROUND

This invention relates to the field of laser radiation generation in the bands II and III, namely 2 to 5 μm and 8 to 12 μm, respectively.

Other than gas lasers, there are no other lasers at the present time covering this region; in particular there are no diode-pumped solid-state lasers covering the region.

The prior art consists of using laser sources emitting close to the visible range (1.060 μm) and converting this wavelength to infrared using nonlinear effects.

Thus, U.S. patent application Ser. No. 2003/0012491 is known; and describes a device able to generate laser radiation in the infrared range, and which has means for generating an optical signal to be amplified, means for generating a pumping optical signal, means for coupling these two signals, and means for amplification and conversion to infrared consisting of an optical fiber with at least 25 mole % chalcogenide having elements such as sulfur, selenium, tellurium, or combinations thereof.

By the stimulated Raman effect, the optical radiation from the coupler is amplified and its frequency is displaced in the optical fiber.

However, as shown in particular in Example 2 of said patent application, the frequency variation in such a fiber is small, namely 1.91 μm and 6.2 μm respectively at the output for input wavelengths of 1.83 μm and 5.4 μm.

Hence, to produce in the entire infrared spectrum, namely 2 to 12 μm, it is preferable to have, at the input, a beam with a frequency close to the desired frequency. Hence it is necessary to use lasers such as $CO_2$ or HFDF. The implementation of such lasers is technically complex in the context of optoelectronic counter-measures, particularly on board aircraft, and they are bulky (space occupied; gas recycling). Moreover, such a device has practically no frequency agility because, at most, a small number of discrete frequencies are available at the outputs, yet such a property is essential in the context of optoelectronic counter-measures.

SUMMARY

The goal of the invention is to propose a technically simple, small-sized device with great frequency agility, hence particularly suited for use in the context of optoelectronic counter-measures and on aircraft.

The solution provided is a device for generating laser radiation in infrared band II and/or in infrared band III characterized by having at least one diode able to emit a laser radiation in the 1.8-2.1 μm frequency range, at least one current generator able to generate current levels at an adjustable repetition rate, means for supplying said current levels to said diode, means for amplifying the laser radiation emitted by said diode and comprised of at least one fiber doped with an ion having laser activity in the diode emission range, and means able to modify the amplified radiation frequency coming from the amplification means.

According to an additional feature that permits frequency agility, the device has several diodes chosen with different wavelengths and/or means for controlling the temperature of said at least one diode enabling its wavelength to be continuously controlled.

According to one particular feature, the temperature control means of said at least one diode is able to control its temperature over several tens of degrees Celsius greater than or less than room temperature.

According to one particular feature, said fiber is made of silica.

According to another feature, said at least one amplification fiber is doped with thulium in a proportion preferably between 1 and 3 weight percent and possibly with aluminium ions whose proportion is preferably between 10 and 13 weight percent. The use of aluminum ions enables the amplification band of the fiber to be enlarged.

According to another feature, the fiber is made of a glass other than silica, but just as favorable to laser emission of the thulium doping ion, such as for example a fluoride glass or a glass based on lead germanate.

According to one particular feature, the fiber is disposed in a spiral.

According to another feature the length of the fiber is less than 5 meters.

According to another feature, the means able to modify the amplified radiation frequency are comprised of an amplifying Raman medium or a parametric oscillator using crystals such as $ZnGeP_2$ or $AgGaSe_2$ or semiconductors used with quasi-phase matching.

According to an additional feature, the amplifying Raman medium comprises at least one gaseous medium, the gas being preferably chosen from hydrogen, nitrogen, and methane.

According to an additional feature, the amplifying Raman medium is comprised of a hollow gas-filled fiber whose inside wall is metallized or whose inside wall or whose outside wall is covered with metallic or dielectric layers or whose walls have a photonic crystal structure.

According to an additional feature, the output wavelength corresponds to the first Stokes of gas used.

According to another feature, the amplifying Raman medium is solid and comprised of fluoride glass or chalcogenide.

BRIEF DESCRIPTION OF THE DRAWINGS

Other advantages and features of the present invention will emerge from the description of various embodiments of the invention with reference to the attached drawings.

DETAILED DESCRIPTION

Figure 1:
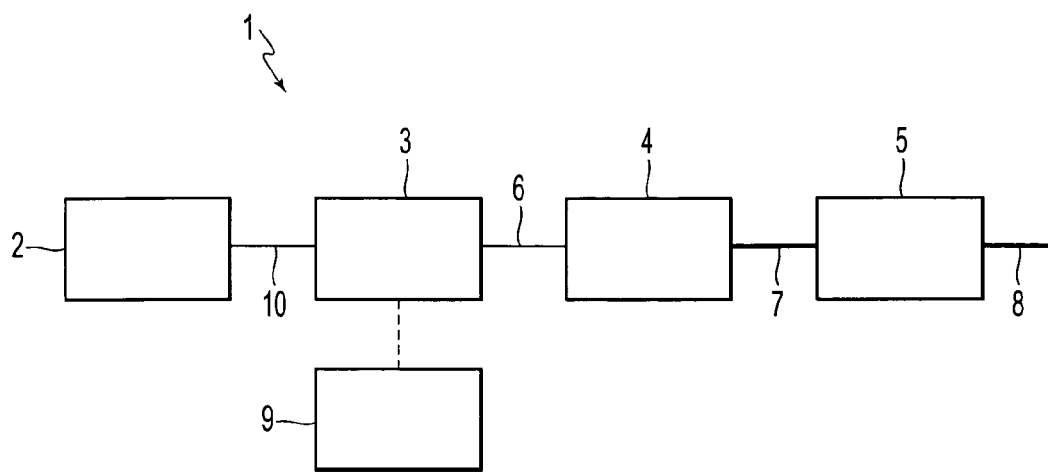
FIG. 1 is a general diagram of the invention.

FIG. 1 is a general diagram of a device for generating infrared laser radiation according to the invention.

This device 1 has at least one diode 3 able to emit laser radiation 6 in the 1.8-2.1 μm frequency range, at least one current generator 2 able to generate current levels 10 at an adjustable frequency, means 10 for supplying these current levels to said diode 3, means 4 for amplifying a laser radiation 6 emitted by said diode and comprised of at least one fiber doped with an ion having laser activity in the emission range of diodes 3, and means 5 able to adjust the amplified radiation frequency using the Raman effect. In this embodiment of the invention, the device also has means for controlling the diode temperature, since such control enables the wavelength of the radiation 6 emitted by the diodes 3 to be controlled. Thus, it is possible to adjust this wavelength by adjusting the temperature of diodes 3, conferring frequency agility on the device.

The pulse generator used is able to generate short pulses lasting from one nanosecond to several tens of nanoseconds at a repetition rate adjustable between a few tens of kHz to several megahertz.

Figure 2:
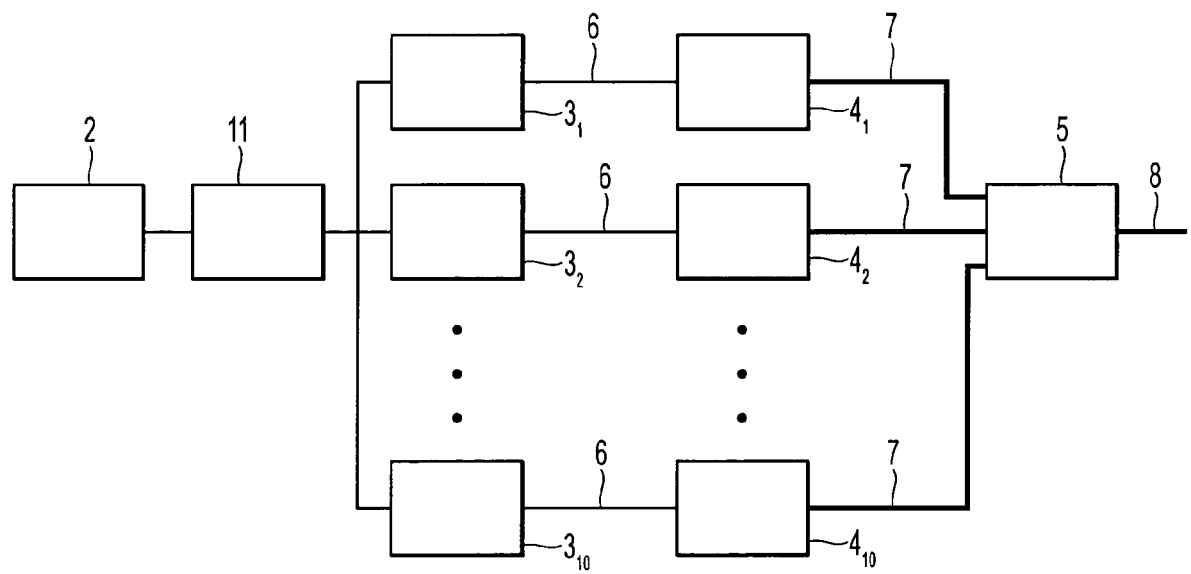
FIG. 2 is a diagram of a first embodiment of the invention.

In the embodiment shown in FIG. 2, the device according to the invention has a current level generator 2 able to supply ten diodes $3_1$ to $3_{10}$ whose emission wavelengths are between 1.85 µm and 2.05 µm, and are regularly distributed over this range at 25° C., namely 1.85 µm for the first, 1.87 µm for the second ... and 2.05 µm for the tenth. The device also has means 11 for selecting the current level feed to the diodes that supplies one diode or several diodes simultaneously.

Each of these ten diodes is connected to an amplification optical fiber 4 made of silica doped with thulium ions and with aluminum ions in the respective proportions of 3 weight percent and 13 weight percent. The output of amplification fiber 3 is placed in a hydrogen Raman medium.

Experience shows that, by implementing the simplest possible mode of Raman medium utilization, namely the first Stokes of hydrogen gas, frequencies between 8 and 12 µm, namely all of band III, are obtained at the output.

Figure 3:
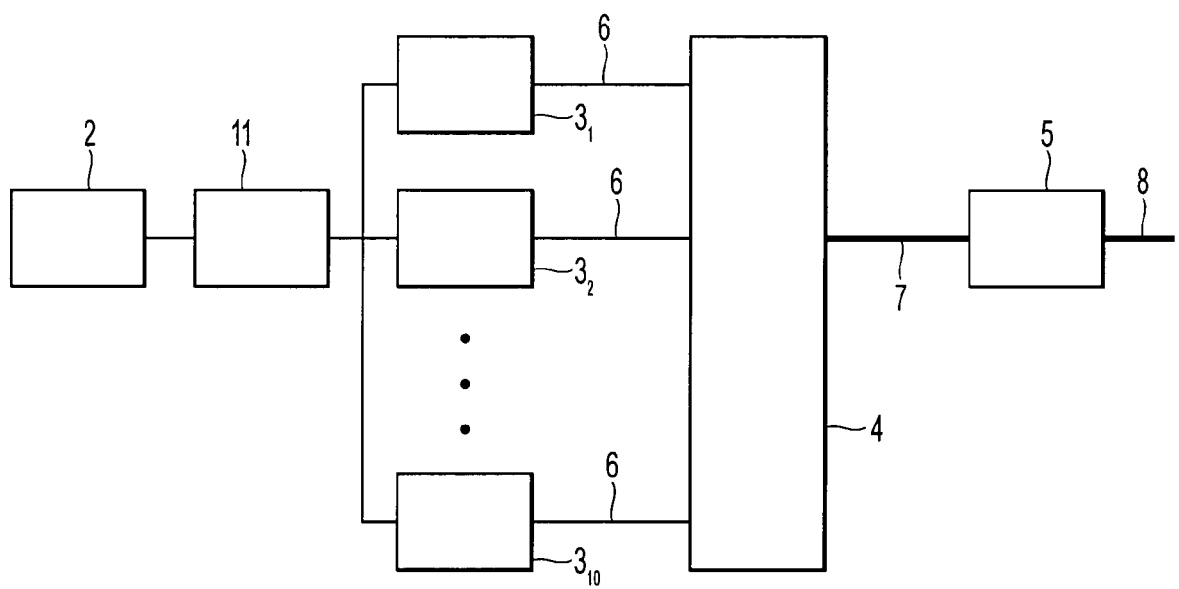
FIG. 3 is a diagram of a second embodiment of the invention.

In the embodiment shown in FIG. 3, the device according to the invention has a current level generator 2 able to supply ten diodes $3_1$ to $3_{10}$, whose emission wavelengths are between 1.85 µm and 2.05 µm and are regularly distributed over this range at 25° C., namely 1.85 µm for the first, 1.87 µm for the second ... and 2.05 µm for the tenth. The device also has means 11 for selecting the current level feed to the diodes to supply one diode or several diodes simultaneously as well as means 9 for controlling the temperature of the diodes.

These ten diodes are connected to an amplification optical fiber 4 doped with thulium ions in a proportion of 3 weight percent, and the output of each of the ten fibers is introduced into a methane Raman medium.

Experience shows that, by using the simplest possible mode of Raman medium, namely the first Stokes of hydrogen gas, frequencies between 3.8 and 5 µm, namely the upper part of band II, are obtained at the output.

Figure 4:
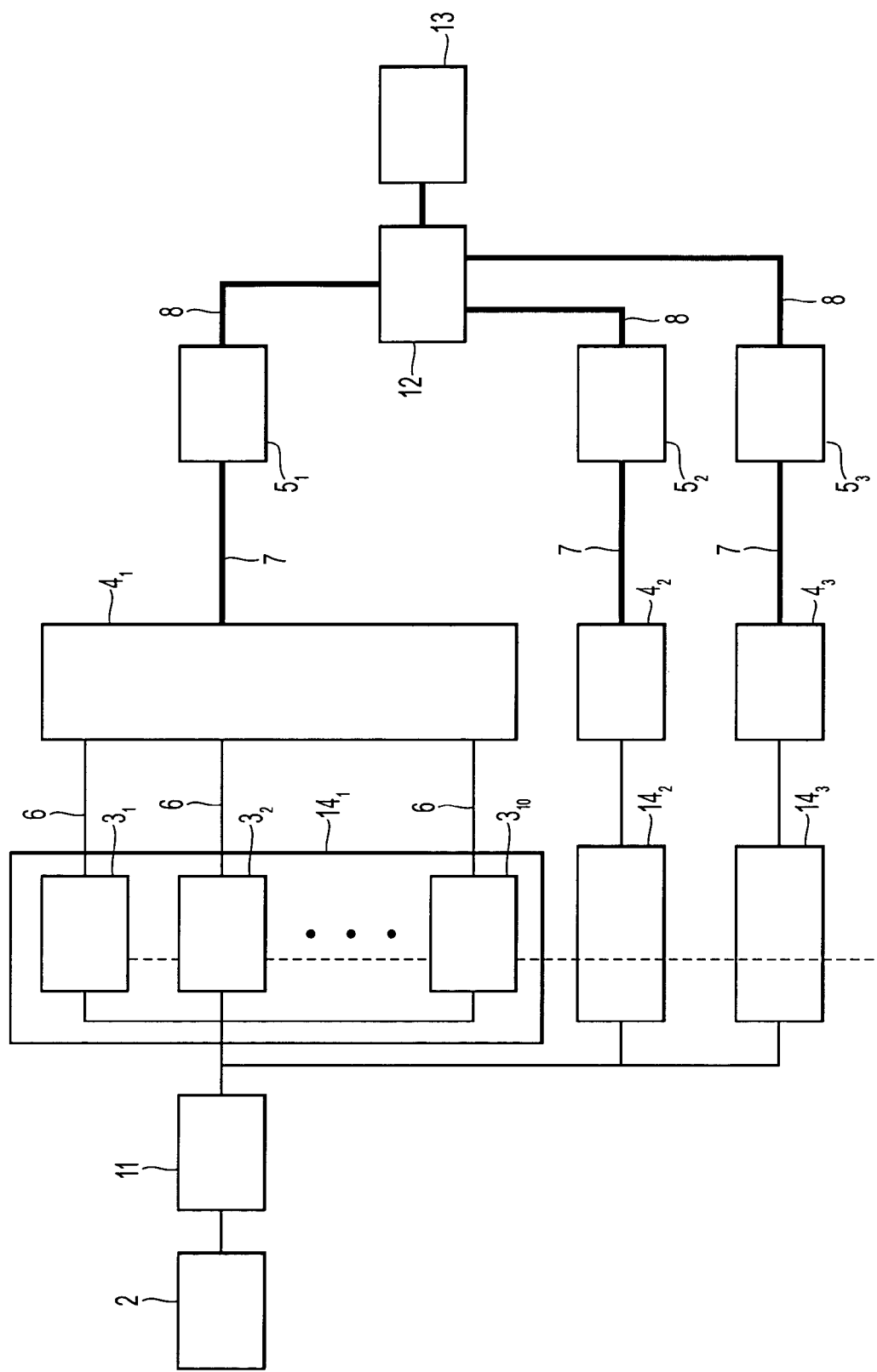
FIG. 4 is a diagram of a third embodiment of the invention.

In the embodiment shown in FIG. 4, the device according to the invention has a current level generator 2 able to supply three sets $14_1$, $14_2$, $14_3$ of ten diodes $3_1$ to $3_{10}$ developed at the University of Freiburg, whose emission wavelengths are between 1.85 µm and 2.05 µm and are regularly distributed over this range at 25° C., namely 1.85 µm for the first, 1.87 µm for the second ... and 2.05 µm for the tenth. The device also has means 11 for selecting the current level feed to all the diodes to supply one diode or several diodes simultaneously.

Each of these sets of ten diodes is connected to an amplification optical fiber 4 sold by Thorlabs, respectively $4_1$, $4_2$, and $4_3$, made of silica and doped with thulium ions in a proportion of 2 weight percent and aluminum ions, 10 weight percent. Its length is approximately 1.5 m and it is wound into a spiral.

The outputs of fibers $4_1$, $4_2$, and $4_3$ are connected respectively to a first nitrogen Raman medium $5_1$, a second methane Raman medium $5_2$, and to a third hydrogen Raman medium $5_3$. In known fashion, the hydrogen under pressure is inside a hollow fiber whose inside wall is metallized, namely covered with a gold film, and the laser radiation is introduced into this hollow fiber.

The device also has means 12 for focusing beams $8_1$, $8_2$, and $8_3$ coming from respective Raman media $5_1$, $5_2$, and $5_3$ into a non-amplifying optical fiber 13 able to route the laser radiation to its utilization point.

Experience shows that by using, in each of the Raman media, the simplest utilization mode, namely the first Stokes, one obtains, for input frequencies of 1.85 µm to 2.05 µm, output frequencies between:
  3 and 3.8 µm for the nitrogen Raman medium,
  3.8 and 5 µm for the methane Raman medium,
  8 and 12 µm for the hydrogen Raman medium, namely almost the entire range usable for counter-measures in bands II and III.

Water vapor has numerous absorption peaks between 2 and 3 µm; hence it is preferable, in the context of optoelectronic counter-measures, to emit at frequencies greater than or equal to 3 µm.

In this embodiment, the current level generator 2 and the means 11 for selecting the current level fed to the diodes are controlled by a microcomputer. Thus, it is possible to control the repetition rate of the current levels and the diode or diodes to which it is applied. When a current level is transmitted to one of laser diodes 3, the latter emits a laser pulse whose frequency is fixed at a given temperature, but which can vary when its temperature is adjusted by about $10^{-10}$ m per degree in this embodiment.

This laser pulse, at frequency λ, enters into the corresponding fiber 4 in which its power is amplified by a factor greater than $10^4$. The output pulses have sufficient power to enable satisfactory conversion yields to be obtained in Raman media 5.

The pulse then enters the corresponding Raman medium in which its frequency is modified according to the frequency of the first Stokes of gas used, namely by the following wave factors:
  4155 $cm^{-1}$ for hydrogen
  2941 $cm^{-1}$ for methane
  2311 $cm^{-1}$ for nitrogen.

Thus, depending on the diode to which the current level is applied, the output current pulse will be between 3 and 5 µm or 8 and 12 µm, which enables the emission frequency to be varied in real time as well, of course, as the emission frequency of this pulse which can reach several tens of MHz.

In another embodiment, the means (5) for adjusting the amplified radiation frequency coming from the amplification means are comprised of two hollow fibers disposed in parallel whose respective inside walls, or outside walls, are covered with a coating composed of superimposed successive layers of metal, for example silver, and a dielectric with a broad reflectivity band, such as silver iodide, as described for example in the article by T. Abel, J. Hirsch and J. A. Harrington, entitled: "Hollow Glass Waveguides for Broadband Infrared Transmission" which appeared in Optics Letters, Vol. 19, 14 (1994), p. 1034. In this case, one of the hollow fibers whose inside wall is covered with a coating is made of silica and is used to obtain infrared radiation in band III while the other, made of fluoride glass, has its outside wall covered with said coating and enables infrared radiation to be obtained in band II. The diameter of these fibers containing gas under pressure, namely methane for band II and hydrogen for band III, is approximately 20 µm for a length of approximately one meter.

In another embodiment, the means (5) for adjusting the amplified radiation frequency coming from the amplification means are comprised of two hollow fibers with photonic crystals as described in the article by F. Benabid et al. entitled "Stimulated Raman Scattering in Hydrogen-Filled Hollow-Core Photonic Crystal Fiber" which appeared in Science, Vol. 298 (Oct. 11, 2002), p. 399. These fibers contain, respectively, pressurized hydrogen and pressurized methane, and the radiation coming from the amplification means is directed to one or the other of these photonic crystal fibers depending on the desired wavelength at the output of means 5. These photonic crystal fibers are dual-band, namely they have very little loss in the wavelengths of the diodes as well as those of the first Stokes line of the gas they contain.

Of course, numerous modifications can be made to the embodiment described above without departing from the framework of the invention. Thus, the Raman medium may in particular be a fluoride glass fiber with which the fourth Stokes would be used, in this case requiring a phase-matching device. Also, to increase amplification efficiency, a preamplification stage and a power amplifier may be associated with the amplification means 4 described above.

What is claimed is:

1. Device for generating laser radiation in infrared band II and/or in infrared band III comprising: —at least one diode able to emit a first laser radiation at a wavelength, —at least one current pulse generator able to generate current pulses at an adjustable repetition rate, —means for supplying the current pulses to the diode, —amplification means for amplifying the first laser radiation at the first wavelength emitted by the diode, and—shifting means able to shift the wavelength of the amplified radiation amplified by the amplification means into a second laser radiation wavelength in infrared band II or in infrared band III, wherein: the at least one diode is able to emit a first laser radiation at a wavelength in the 1.8-2.1 µm range, —the amplification means comprises at least one fiber doped with an ion having laser activity in the diode emission range, and—the shitting means is constituted by a Raman medium which comprises at least one gas medium, and the Raman medium is able to convert the wavelength of the amplified radiation into the second laser radiation wavelength in the infrared band II and/or the infrared band III.

2. Device according to claim 1, wherein the at least one diode comprises a plurality of diodes, each diode having a different wavelength.

3. Device according to claim 2, further comprising means for controlling the temperature of the at least one diode enabling wavelength to be continuously controlled.

4. Device according to claim 3, wherein the temperature control means of the at least one diode are able to control the diode's temperature over several tens of degrees Celsius greater than or less than room temperature.

5. Device according to claim 1, wherein the amplification means comprises an amplifying fiber doped with thulium.

6. Device according to claim 5, wherein the fiber is made of silica, fluoride glass, or lead germanate glass.

7. Device according to claim 5, wherein the amplifying fiber is made of silica doped with aluminum ions.

8. Device according to claim 4, wherein the amplification means comprises an amplifying fiber disposed in a spiral.

9. Device according to claim 7, wherein the length of amplifying fiber is less than 5 meters.

10. Device according to claim 1, wherein the at least one gas medium is chosen from hydrogen, nitrogen, and methane.

11. Device according to claim 10, wherein the output frequency of the Raman medium corresponds to the first Stokes of gas used.

12. Device according to claim 10, wherein the Raman medium is comprised of a gas-filled hollow fiber whose inside wall is metallized.

13. Device according to claim 10, wherein the Raman medium is comprised of a gas-filled hollow fiber whose inside wall or whose outside wall has a coating having at least one metallized layer and one dielectric layer.

14. Device according to claim 10, wherein the Raman medium is comprised of a hollow fiber with dual-band photonic crystals.

15. Device according claim 1, wherein the amplification means amplifies the first laser radiation without modifying the first laser radiation's wavelength.

16. Device according to claim 5, wherein the amplifying fiber is doped with the thulium in a proportion between 1 and 3 weight percent.

17. Device according to claim 7, wherein the amplifying fiber is doped with the aluminum ions in a proportion between 10 and 13 weight percent.

18. Device according to claim 7, wherein the amplifying fiber is doped with the thulium in a proportion between 1 and 3 weight percent and the aluminum ions in a proportion between 10 and 13 weight percent.

* * * * *